(12) United States Patent
Chuang et al.

(10) Patent No.: US 11,735,800 B2
(45) Date of Patent: Aug. 22, 2023

(54) FREQUENCY TUNING METHOD IN ROTARY-BASED OSCILLATOR

(71) Applicant: Samsung Electronics Co., Ltd., Suwon-si (KR)

(72) Inventors: Tsung-Hao Chuang, San Francisco, CA (US); Daquan Huang, Allen, TX (US); Michael Chen, Dallas, TX (US); Shenggang Dong, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/381,100

(22) Filed: Jul. 20, 2021

(65) Prior Publication Data

US 2022/0045410 A1 Feb. 10, 2022

Related U.S. Application Data

(60) Provisional application No. 63/063,548, filed on Aug. 10, 2020.

(51) Int. Cl.
| | |
|---|---|
| *H03B 5/18* | (2006.01) |
| *H03B 27/00* | (2006.01) |
| *H01P 1/18* | (2006.01) |
| *H01P 3/02* | (2006.01) |
| *H03B 28/00* | (2006.01) |

(52) U.S. Cl.
CPC .................. *H01P 1/18* (2013.01); *H01P 3/02* (2013.01); *H03B 5/18* (2013.01); *H03B 27/00* (2013.01); *H03B 28/00* (2013.01)

(58) Field of Classification Search
CPC ...... H01P 1/18; H01P 3/02; H01P 3/08; H01P 3/081; H01P 7/08; H01P 7/082; H01P 7/086; H01P 7/088; H03B 5/18; H03B 5/1841; H03B 5/1847; H03B 5/1852; H03B 27/00; H03B 28/00; H03B 2200/0024

See application file for complete search history.

(56) References Cited

U.S. PATENT DOCUMENTS

| | | | |
|---|---|---|---|
| 5,401,953 A | 3/1995 | Spencer et al. | |
| 7,091,802 B2 * | 8/2006 | Ham | H03B 5/1841 333/246 |
| 7,852,176 B2 | 12/2010 | Chang et al. | |

(Continued)

OTHER PUBLICATIONS

International Search Report and Written Opinion of the International Searching Authority dated Nov. 11, 2021, in connection with International Application No. PCT/KR2021/010405, 7 pages.

(Continued)

*Primary Examiner* — Levi Gannon

(57) ABSTRACT

The present disclosure relates to an oscillator apparatus comprising a differential transmission line forming a closed loop, a plurality of active core components that are electrically connected to the differential transmission line and that are configured to compensate for loss in the differential transmission line, a plurality of tuning elements that are electrically coupled with the differential transmission line, and a processor configured to control each tuning element of the plurality of tuning elements to activate or deactivate such that an effective electrical length of the differential transmission line is changed.

17 Claims, 6 Drawing Sheets

(56) References Cited

U.S. PATENT DOCUMENTS

| | | |
|---|---|---|
| 7,973,609 B2 | 7/2011 | Ohara et al. |
| 8,183,943 B2 * | 5/2012 | Cheung .................. H03L 7/099 |
| | | 331/181 |
| 8,264,300 B2 * | 9/2012 | Cisco ....................... H01P 9/00 |
| | | 333/164 |
| 8,350,629 B2 | 1/2013 | Parrott et al. |
| 8,598,926 B2 | 12/2013 | Trotta |
| 8,760,244 B2 * | 6/2014 | Kawai ...................... H01P 5/00 |
| | | 333/205 |
| 9,118,335 B2 * | 8/2015 | Wu .......................... H04B 1/26 |
| 10,062,949 B2 | 8/2018 | Cheng et al. |
| 10,903,841 B1 * | 1/2021 | Parvizi ..................... H03L 7/18 |
| 2009/0273404 A1 | 11/2009 | Hay |
| 2010/0134195 A1 | 6/2010 | Lee et al. |
| 2011/0140798 A1 | 6/2011 | Chang et al. |
| 2018/0234053 A1 | 8/2018 | Liu et al. |
| 2018/0267144 A1 * | 9/2018 | Lin .......................... G01S 7/42 |
| 2020/0014330 A1 | 1/2020 | Bushman et al. |

OTHER PUBLICATIONS

Chien, Jun-Chau, et al., "A 32-GHz Rotary Traveling-Wave Voltage Controlled Oscillator in 0.18-μm CMOS", IEEE Microwave and Wireless Components Letters, vol. 17, No. 10, Oct. 2007, 3 pgs.

Nouri, Neda, et al., "A45-GHz Rotary-Wave Voltage-Controlled Oscillator", IEEE Transactions on Microwave Theory and Techniques, vol. 59, No. 2, Feb. 2011, 10 pgs.

\* cited by examiner

FREQUENCY TUNING METHOD IN ROTARY-BASED OSCILLATOR

CROSS-REFERENCE TO RELATED APPLICATION(S) AND CLAIM OF PRIORITY

This application claims priority under 35 U.S.C. § 119(e) to U.S. Provisional Patent Application No. 63/063,548 filed on Aug. 10, 2020, which is hereby incorporated by reference in its entirety.

TECHNICAL FIELD

This disclosure relates generally to radio front ends in wireless communications systems. Embodiments of this disclosure relate to methods and apparatuses for providing a tunable, low-noise, stable frequency source for frequency upconversion and downconversion in front ends in a wireless communications system.

BACKGROUND

Local oscillators (LOs) are an essential building block in radio frequency (RF) and millimeter wave (mmWave) front end integrated circuit (IC) designs for wireless communication and sensing applications. The goal of the LO is to provide a tunable, low noise, and stable frequency source (e.g., a clock) to upconvert and downconvert the baseband or RF/mmWave signal to transmit or receive the desired information to and from the antenna in a wireless communications device. In particular, low phase noise and frequency tuning capability are the key metrics for LO performance, and therefore also for RF and mmWave front end IC performance.

As mmWave 5G technology is well on its way into deployment, initial 6G study and development has kicked off, which may use mmWave bands at 100 GHz or above, and terahertz (THz) bands. Front end transceiver IC design at mmWave frequency will play an even more critical and prominent role in the near future. Designing LOs with a wide frequency tuning range and low phase noise at mmWave frequency is critical yet challenging due to physical device limitations, novel circuit topology, and design techniques required to address such challenges. In addition to wireless communications, other useful applications for wide tuning range and low phase noise LOs include frequency modulated continuous wave (FMCW) radars, image sensing and satellite communication.

SUMMARY

Embodiments of the present disclosure provide a method and an apparatus for operating a local oscillator. In one embodiment, an oscillator apparatus is provided, comprising a differential transmission line forming a closed loop, a plurality of active core components that are electrically connected to the differential transmission line and that are configured to compensate for loss in the differential transmission line, a plurality of tuning elements that are electrically coupled with the differential transmission line, and a processor configured to control each tuning element of the plurality of tuning elements to activate or deactivate such that an effective electrical length of the differential transmission line is changed.

In another embodiment, an oscillator apparatus is provided, comprising a differential transmission line forming a closed loop, a plurality of active core components that are electrically connected to the differential transmission line and that are configured to compensate for loss in the differential transmission line, a plurality of frequency multipliers that are electrically connected to the differential transmission line and that are configured to extend a frequency tuning range of the oscillator apparatus, a plurality of tuning elements that are electrically coupled with the differential transmission line, and a processor configured to control each tuning element of the plurality of tuning elements to activate or deactivate such that an effective electrical length of the differential transmission line is changed.

In another embodiment, a method of an oscillator is provided, including the steps of compensating for loss, by a plurality of active core components, in a differential transmission line forming a closed loop, activating or deactivating, by a processor, each tuning element of a plurality of tuning elements such that an effective electrical length of the differential transmission line is changed, wherein the plurality of tuning elements are electrically coupled to the differential transmission line. The method may further comprise multiplying, by a plurality of frequency multipliers, a frequency of an output of each of the plurality of segments.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
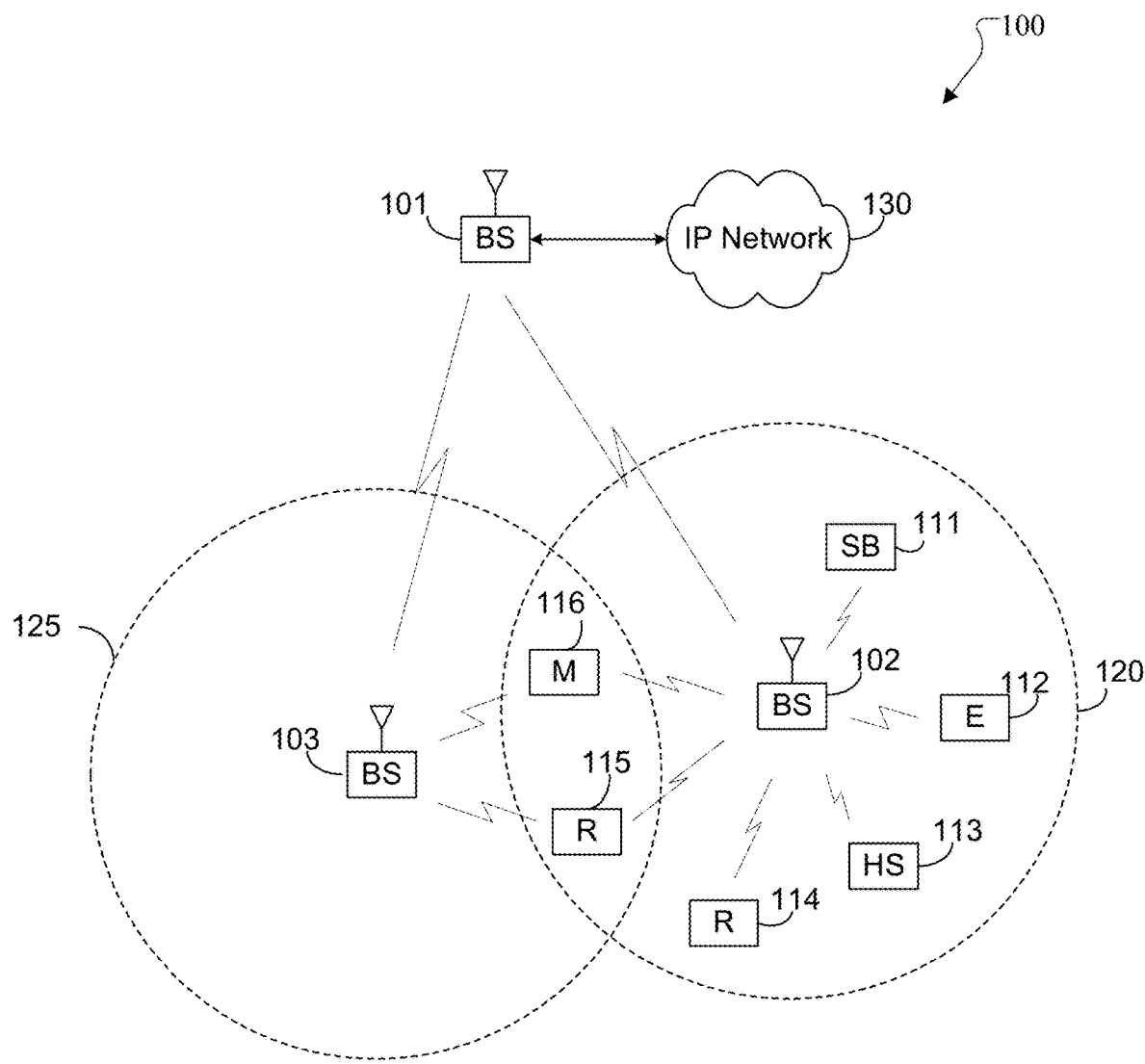
FIG. 1 illustrates an example wireless network, which transmits signals according to the principles of the present disclosure.

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

To meet the demand for wireless data traffic having increased since deployment of 4G communication systems and to enable various vertical applications, 5G/NR communication systems have been developed and are currently being deployed. The 5G/NR communication system is considered to be implemented in higher frequency (mmWave) bands, e.g., 28 GHz or 60 GHz bands, so as to accomplish higher data rates or in lower frequency bands, such as 6 GHz, to enable robust coverage and mobility support. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G/NR communication systems.

In addition, in 5G/NR communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

The discussion of 5G systems and frequency bands associated therewith is for reference as certain embodiments of the present disclosure may be implemented in 5G systems. However, the present disclosure is not limited to 5G systems or the frequency bands associated therewith, and embodiments of the present disclosure may be utilized in connection with any frequency band. For example, aspects of the present disclosure may also be applied to deployment of 5G communication systems, 6G or even later releases which may use terahertz (THz) bands.

Embodiments of the present disclosure recognize that as 5G and beyond 5G wireless communications systems move into higher carrier frequency bands it becomes increasingly challenging to manage power consumption, size, and loss in radio front ends. When designing LOs for, e.g., 100 GHz to 1 THz front ends, Embodiments of the present disclosure recognize that low phase noise and wide frequency tuning range are the two key metrics in local oscillator (LO) design. Phase noise in the LO corrupts baseband data that is upconverted using the LO in transmitters, or baseband data that is the result of down-conversion using the LO in receivers. In LO RFIC design, low phase noise and wide frequency tuning range are often traded-off with each other due to the lossy nature of active and passive devices on the silicon die. For example, some design solutions use a series of frequency multipliers to multiply a relatively low frequency (e.g., 15 GHz) LO signal to a 100 GHz range frequency, but such frequency multiplication is very power consuming, and cascading a series of frequency multipliers reduces the frequency tuning range.

Embodiments of the present disclosure recognize that a rotary-based oscillator (e.g., a rotary voltage-controlled oscillator (VCO)) is an attractive topology for LO design to address this challenge. A rotary-based oscillator comprises a closed loop transmission-line-based resonator to form a positive feedback loop along with a number of distributed active stages to compensate for loss in the transmission line section to start the oscillator. By distributing the noise contribution from active core devices across split stages, the rotary-based oscillator is inherently superior in phase noise performance compared to conventional lumped VCO core design. However, conventional rotary VCO frequency tuning mechanisms are based on either diode or varactor tuning, which limits the tuning and degrades the phase noise due to the low quality factor of the diodes and the varactors.

The present disclosure provides novel frequency tuning methods and apparatuses for rotary-based LO design that achieves low phase noise and wide frequency tuning range simultaneously. To achieve wide tuning range and low phase noise in a rotary-based LO design simultaneously, the proposed frequency tuning method is to adjust the electrical length of the closed loop transmission-line-based resonator in the rotary topology. Once the electrical length of the transmission line loop is changed, the period for electrons to go around the full transmission line loop is changed, therefore the frequency of oscillation will be varied.

FIG. 1 illustrates an example wireless network 100, which transmits signals according to the principles of the present disclosure. In the illustrated embodiment, wireless network 100 includes a next generation NodeB (gNodeB or gNB) 101, a gNB 102, and a gNB 103. The gNB 101 communicates with the gNB 102 and the gNB 103. The gNB 101 also communicates with at least one Internet Protocol (IP) network 130, such as the Internet, a proprietary IP network, or other data network.

Depending on the network type, other well-known terms may be used instead of "gNodeB" or "gNB," such as "base station" (BS) or "access point" (AP). For the sake of convenience, the terms "gNodeB" and "gNB" are used in this disclosure to refer to network infrastructure components that provide wireless access to remote terminals. Also, depending on the network type, other well-known terms may be used instead of "user equipment" (UE), such as "mobile station," "subscriber station," "remote terminal," "wireless terminal," or "user device." For the sake of convenience, the terms "user equipment" and "UE" are used in this disclosure to refer to remote wireless equipment that wirelessly accesses a gNB, whether the UE is a mobile device (such as a mobile telephone or smartphone) or is normally considered a stationary device (such as a desktop computer or vending machine).

The gNB 102 provides wireless broadband access to the network 130 for a first plurality of UEs within a coverage area 120 of the gNB 102. The first plurality of UEs includes a UE 111, which may be located in a small business; a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The gNB 103 provides wireless broadband access to the network 130 for a second plurality of UEs within a coverage area 125 of the gNB 103. The second plurality of UEs includes the UE 115 and the UE 116. In some embodiments, one or more of the gNBs 101-103 may communicate with each other and with the UEs 111-116 using 5G, 4G long-term evolution (LTE), 4G LTE Advanced (LTE-A), Worldwide Interoperability for Microwave Access (WiMAX), or other advanced wireless communication techniques.

Dotted lines show the approximate extents of the coverage areas 120 and 125, which are shown as approximately circular for the purposes of illustration and explanation only. It should be clearly understood that the coverage areas associated with gNBs, such as the coverage areas 120 and 125, may have other shapes, including irregular shapes, depending upon the configuration of the gNBs and variations in the radio environment associated with natural and man-made obstructions.

As described in more detail below, one or more of gNB 101, gNB 102 and gNB 103 include 2D antenna arrays in accordance with embodiments of the present disclosure. As disclosed in further detail below, front end modules in the gNBs provide frequency upconversion and downconversion for transmitting and receiving signals through these 2D antenna arrays. In some embodiments, the front end modules support mmWave or higher frequency signals.

Although FIG. 1 illustrates one example of a wireless network 100, various changes may be made to FIG. 1. For example, the wireless network 100 can include any number of gNBs and any number of UEs in any suitable arrangement. Also, the gNB 101 can communicate directly with any number of UEs and provide those UEs with wireless broadband access to the network 130. Similarly, each gNB 101-103 can communicate directly with the network 130 and provide UEs with direct wireless broadband access to the network 130. Furthermore, the gNBs 101-103 can provide access to other or additional external networks, such as external telephone networks or other types of data networks.

Figure 2:
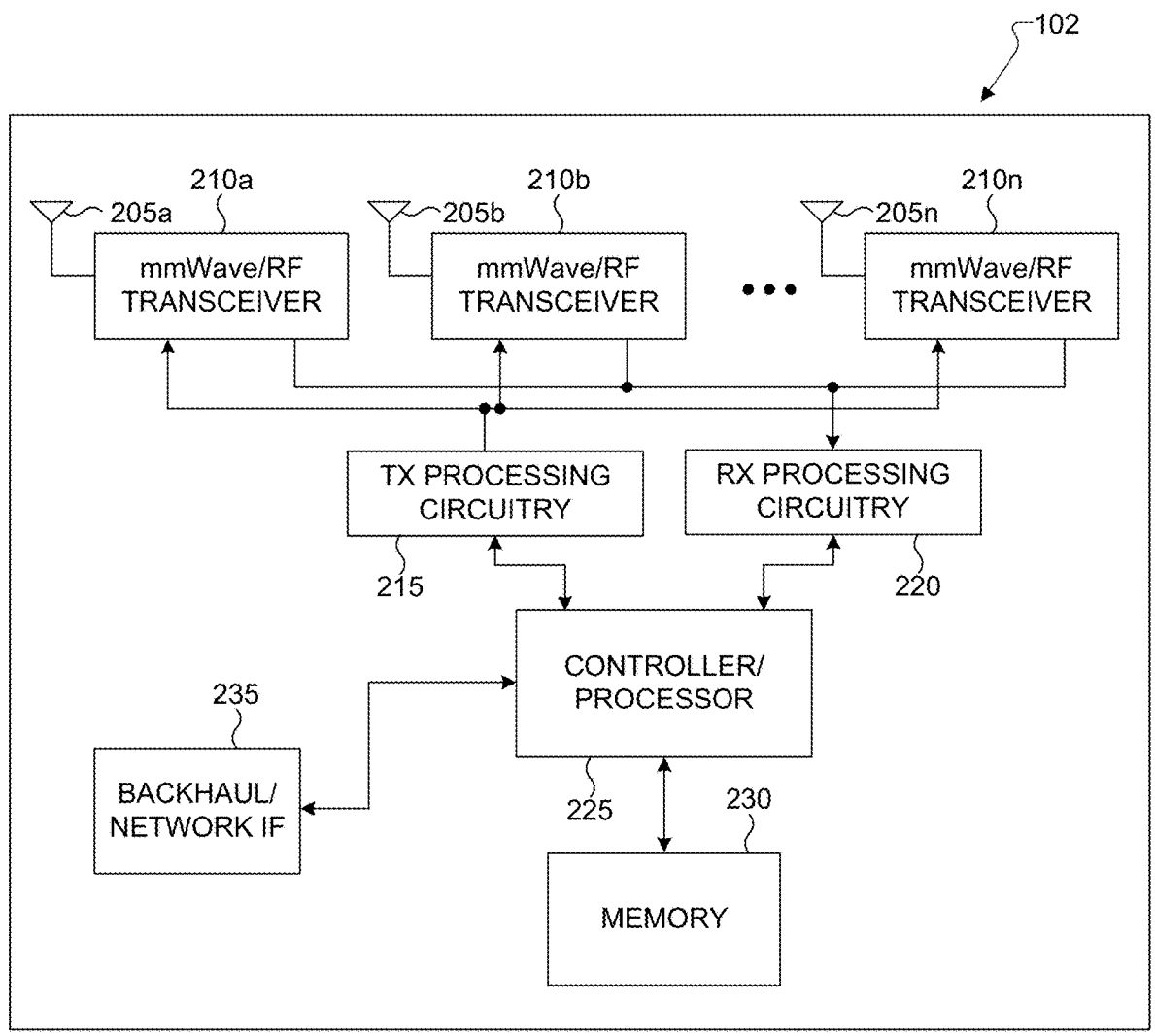
FIG. 2 illustrates an example gNodeB (gNB) according to embodiments of the present disclosure.

FIG. 2 illustrates an example gNB 102 according to embodiments of the present disclosure. The embodiment of the gNB 102 illustrated in FIG. 2 is for illustration only, and the gNB 102 of FIG. 1 could have the same or similar configuration. However, gNBs come in a wide variety of configurations, and FIG. 2 does not limit the scope of this disclosure to any particular implementation of a gNB. It is noted that gNB 101 and gNB 103 can include the same or similar structure as gNB 102.

As shown in FIG. 2, the gNB 102 includes multiple antennas 205a-205n, multiple mmWave/RF transceivers 210a-210n, transmit (TX) processing circuitry 215, and receive (RX) processing circuitry 220. In some embodiments, one or more of the multiple antennas 205a-205n include 2D antenna arrays. The gNB 102 also includes a controller/processor 225, a memory 230, and a backhaul or network interface 235.

The mmWave/RF transceivers 210a-210n receive, from the antennas 205a-205n, incoming mmWave/RF signals, such as signals transmitted by UE 116 or other UEs in the network 100. The mmWave/RF transceivers 210a-210n downconvert the incoming mmWave/RF signals to generate IF or baseband signals. This downconversion utilizes a LO, which can be a rotary-based LO according to embodiments of this disclosure. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives digital data (such as voice data, web data, e-mail, or interactive video game data) from the controller/processor 225. The TX processing circuitry 215 encodes, multiplexes, and/or digitizes the outgoing baseband data to generate processed baseband or IF signals. The mmWave/RF transceivers 210a-210n receive the outgoing processed baseband or IF signals from the TX processing circuitry 215 and upconvert the baseband or IF signals to outgoing mmWave/RF signals that are transmitted via the antennas 205a-205n. This upconversion utilizes a LO, which can be a rotary-based LO according to embodiments of this disclosure.

The controller/processor 225 can include one or more processors or other processing devices that control the overall operation of the gNB 102. For example, the controller/processor 225 could control the reception of forward channel signals and the transmission of reverse channel signals by the mmWave/RF transceivers 210a-210n, the RX processing circuitry 220, and the TX processing circuitry 215 in accordance with well-known principles. The controller/processor 225 could support additional functions as well, such as more advanced wireless communication functions.

For instance, the controller/processor 225 could support beam forming or directional routing operations in which outgoing signals from multiple antennas 205a-205n are weighted differently to effectively steer the outgoing signals in a desired direction. Any of a wide variety of other functions could be supported in the gNB 102 by the controller/processor 225.

The controller/processor 225 is also capable of executing programs and other processes resident in the memory 230, such as an operating system (OS). The controller/processor 225 is also capable of supporting channel quality measurement and reporting for systems having 2D antenna arrays as described in embodiments of the present disclosure. In some embodiments, the controller/processor 225 supports communications between entities, such as web RTC. The controller/processor 225 can move data into or out of the memory 230 as required by an executing process.

The controller/processor 225 is also coupled to the backhaul or network interface 235. The backhaul or network interface 235 allows the gNB 102 to communicate with other devices or systems over a backhaul connection or over a network. The interface 235 could support communications over any suitable wired or wireless connection(s). For example, when the gNB 102 is implemented as part of a cellular communication system (such as one supporting 5G, LTE, or LTE-A), the interface 235 could allow the gNB 102 to communicate with other gNBs over a wired or wireless backhaul connection. When the gNB 102 is implemented as an access point, the interface 235 could allow the gNB 102 to communicate over a wired or wireless local area network or over a wired or wireless connection to a larger network (such as the Internet). The interface 235 includes any suitable structure supporting communications over a wired or wireless connection, such as an Ethernet or mmWave/RF transceiver.

The memory 230 is coupled to the controller/processor 225. Part of the memory 230 could include a random access memory (RAM), and another part of the memory 230 could include a Flash memory or other read-only memory (ROM).

Although FIG. 2 illustrates one example of gNB 102, various changes may be made to FIG. 2. For example, the gNB 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the gNB 102 could include multiple instances of each (such as one per mmWave/RF transceiver). Also, various components in FIG. 2 could be combined, further subdivided, or omitted and additional components could be added according to particular needs.

Figure 3:
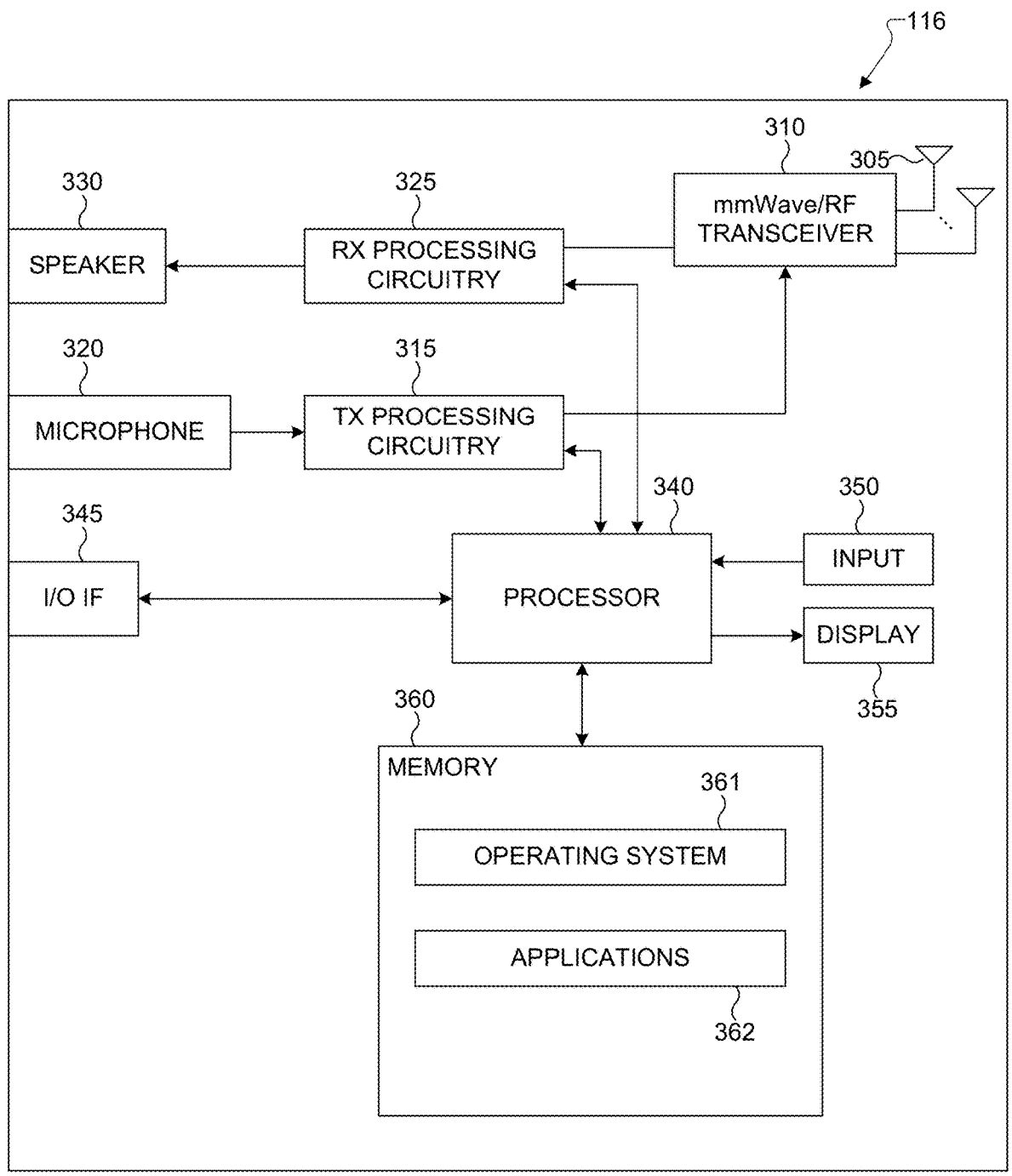
FIG. 3 illustrates an example user equipment (UE) according to embodiments of the present disclosure.

FIG. 3 illustrates an example UE 116 according to embodiments of the present disclosure. The embodiment of the UE 116 illustrated in FIG. 3 is for illustration only, and the UE 116 of FIG. 1 could have the same or similar configuration. However, UEs come in a wide variety of configurations, and FIG. 3 does not limit the scope of this disclosure to any particular implementation of a UE.

As shown in FIG. 3, the UE 116 includes an antenna 305, an mmWave/RF transceiver 310, TX processing circuitry 315, a microphone 320, and RX processing circuitry 325. In some embodiments, the antenna 305 is a 2D antenna array. The UE 116 also includes a speaker 330, a processor 340, an input/output interface (I/O IF) 345, a touchscreen 350, a display 355, and a memory 360. The memory 360 includes an OS 361 and one or more applications 362.

The mmWave/RF transceiver 310 receives, from the antenna 305, an incoming RF signal transmitted by a gNB, such as gNB 102, of the network 100. The mmWave/RF transceiver 310 downconverts the incoming mmWave/RF signal to generate an IF or baseband signal. This downconversion utilizes a LO, which can be a rotary-based LO according to embodiments of this disclosure. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data (such as web data, e-mail, or interactive video game data) from the processor 340. The TX processing circuitry 315 encodes, multiplexes, and/or digitizes the outgoing baseband data to generate a processed baseband or IF signal. The mmWave/RF transceiver 310 receives the outgoing processed baseband or IF signal from the TX processing circuitry 315 and upconverts the baseband or IF signal to an outgoing mmWave/RF signal that is transmitted via the antenna 305. This upconversion utilizes a LO, which can be a rotary-based LO according to embodiments of this disclosure.

The processor 340 can include one or more processors or other processing devices and execute the OS 361 stored in the memory 360 in order to control the overall operation of the UE 116. For example, the processor 340 could control the reception of forward channel signals and the transmission of reverse channel signals by the mmWave/RF transceiver 310, the RX processing circuitry 325, and the TX processing circuitry 315 in accordance with well-known principles. In some embodiments, the processor 340 includes at least one microprocessor or microcontroller.

The processor 340 is also capable of executing other processes and programs resident in the memory 360, such as operations for channel quality measurement and reporting for systems having 2D antenna arrays as described in embodiments of the present disclosure. The processor 340 can move data into or out of the memory 360 as required by an executing process. In some embodiments, the processor 340 is configured to execute the applications 362 based on the OS 361 or in response to signals received from gNBs or an operator. The processor 340 is also coupled to the I/O interface 345, which provides the UE 116 with the ability to connect to other devices, such as laptop computers and handheld computers. The I/O interface 345 is the communication path between these accessories and the processor 340.

The processor 340 is also coupled to the touchscreen 350 and the display 355. The operator of the UE 116 can use the touchscreen 350 to enter data into the UE 116. The display 355 may be a liquid crystal display, light emitting diode display, or other display capable of rendering text and/or at least limited graphics, such as from web sites.

The memory 360 is coupled to the processor 340. Part of the memory 360 could include a random access memory (RAM), and another part of the memory 360 could include a Flash memory or other read-only memory (ROM).

Although FIG. 3 illustrates one example of UE 116, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Figure 4:
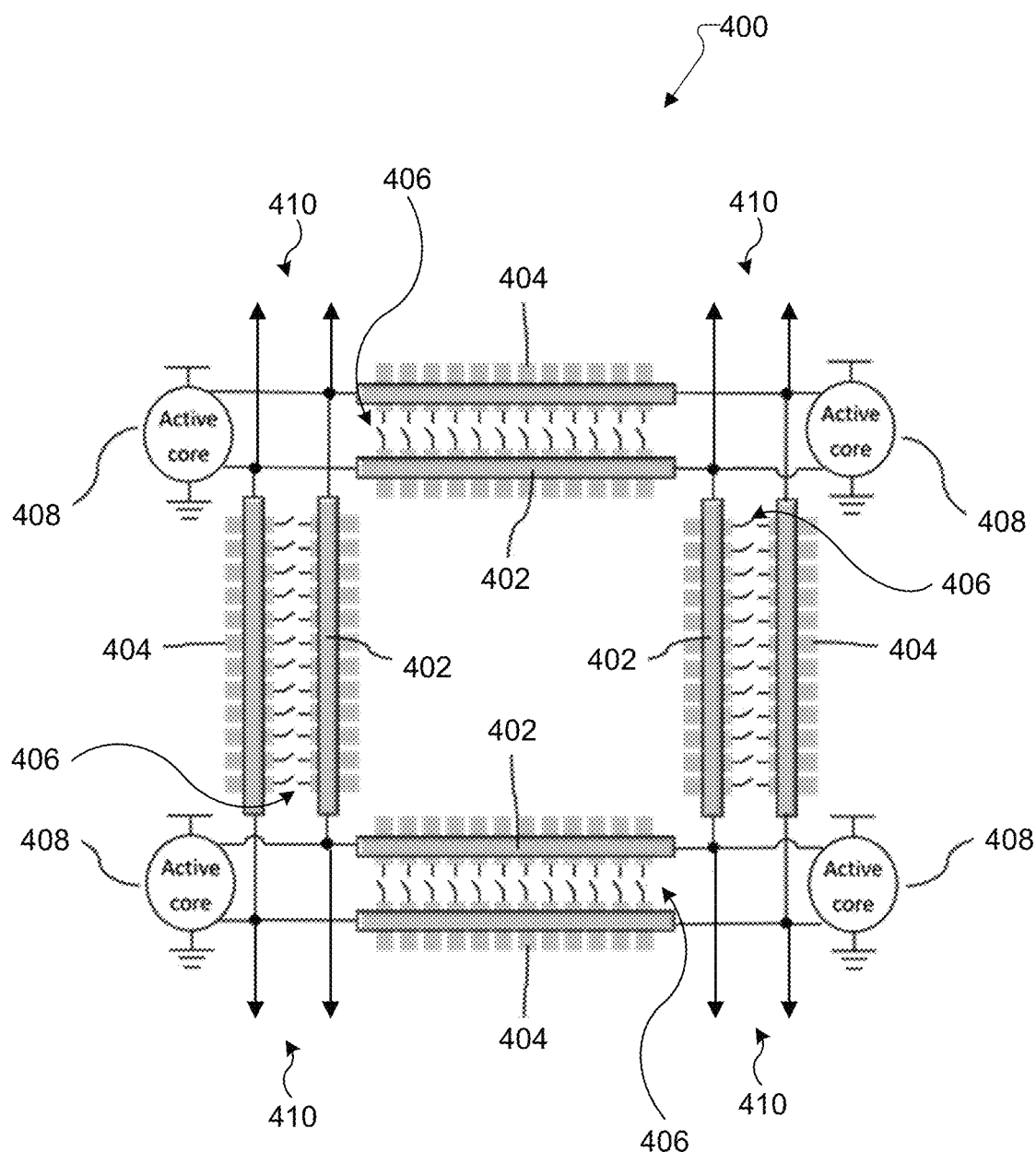
FIG. 4 illustrates a top-down view block diagram of a rotary-based oscillator according to embodiments of the present disclosure.

FIG. 4 illustrates a top-down view block diagram of a rotary-based oscillator 400 according to embodiments of the present disclosure. In this embodiment, the rotary-based oscillator 400 is implemented with semiconductor technology embedded in an IC package. For example, the rotary-based oscillator 400 can be implemented on-chip with other radio front end components. The rotary-based oscillator 400 can be implemented for use as an LO in the gNB 102, the UE 116, or any other wireless communication device of wireless network 100.

The rotary-based oscillator 400 comprises an N-section or N-segment (N=4 in this example) closed loop differential transmission line 402, which acts as a resonator, with tuning elements to tune the frequency of oscillation (i.e., the resonant frequency) of the resonator. Although N=4 in this example, any even number N can be used. When a signal of the resonant frequency travels through the differential transmission line 402, the signal will travel 360 degrees in phase around the loop and feedback positively with itself.

There is inherent loss in the differential transmission line 402 as it is comprised of a conductive material. N stages (N=4 in this example) of distributed active core components 408 are attached to the closed loop differential transmission line 402 to regenerate the signal and compensate for loss, and to start the oscillator. The active core components 408 can be, for example, VCOs. The total gain of the loop is positive as a result. By distributing the phase noise contribution of the active core components 408 across the N stages, phase noise is reduced as compared to using a single active core component for the entire oscillator.

The tuning elements comprise 2-D floating metal mesh stacks 404 disposed underneath and perpendicular to the differential transmission line 402, with corresponding arrays of electrical switches 406 that are configured to short or open the 2-D floating metal mesh stacks 404. Each 2-D floating metal mesh stack 404 can include a plurality of pairs of 2-D metal elements, with each pair spaced apart in a depthwise direction in the IC package medium underneath the differential transmission line 402. One 2-D metal element of each pair is disposed under one leg of the differential transmission line 402. Each pair of 2-D metal elements is bridged by a switch 406, such that the pair of 2-D metal elements is connected (or shorted) when the switch 406 is electrically closed, and the connected pair of 2-D metal elements crosses under both legs of the differential transmission line 402.

A 2-D metal element refers to a conductive element that is substantially two-dimensional, although it is understood that the 2-D metal element has a small amount of thickness in the third dimension. Accordingly, the "dominant" two dimensions of the device, ignoring the small thickness in the third dimension, are referred to as the two dimensions of the 2-D metal element. The 2-D metal elements can be disposed such that a plane defined by the dominant two dimensions of the elements lies perpendicular to the plane defined by the differential transmission line 402.

In some embodiments, the switches 406 can be controlled individually to short or open one 2-D floating metal mesh stack 404 (i.e., to short or open each pair of 2-D metal elements within the 2-D floating metal mesh stack 404). In other embodiments, the switches 406 are configured to be controlled to simultaneously open or close all of the 2-D floating metal mesh stacks 404 corresponding to one section of the closed loop differential transmission line 402. In yet other embodiments, all of the switches 406 are configured to be controlled to open and close simultaneously. The switches 406 can be controlled by, e.g., a controller or processor such as controller/processor 225 of gNB 102 or processor 340 of UE 116.

The frequency of oscillation of the resonator can be tuned by changing the electrical length of the differential transmission line 402 with the tuning elements. By closing or opening varying amounts of the switches 406, the permittivity in the medium experienced by an electric field generated by a signal traveling through the differential transmission line 402 can be varied (e.g., the dielectric constant or permittivity ε in the medium can be varied), and therefore the phase velocity of the differential transmission line 402 will be changed. That is, the electrical length of the differential transmission line 402 will be changed. This means that the period of time required for electrons to travel around the full loop of the differential transmission line 402 will be changed, and as a result, the resonant frequency of the rotary-based oscillator 400 will be changed.

In this way, the resonant frequency of the closed loop differential transmission line 402—and the frequency of oscillation of the rotary-based oscillator 400—can be tuned. By individually controlling the shorting of each 2-D floating metal mesh stack 404, small changes in frequency can be achieved. Accordingly, the resolution of frequency tuning achievable by the rotary-based oscillator 400 is related to the number of 2-D floating metal mesh stacks 404 (and corresponding switches 406) in the rotary-based oscillator 400.

The signal generated by the rotary-based oscillator 400 can be extracted from any of the outputs 410. The signal at each output 410 corresponds to a different phase of the signal traveling around the closed loop differential transmission line 402 (i.e., a signal at the resonant frequency). For example, in this embodiment with 4 outputs 410, the signal at each output 410 is phase shifted by 90 degrees from the signal at the neighboring output 410. By increasing the number N of sections, a larger number phases of the resonant frequency signal can be extracted from the rotary-based oscillator 400. Furthermore, each leg of the differential transmission line 402 is phase shifted 180 degrees with respect to the other leg. As a result, at each output 410, two phases of the resonant frequency signal separated by 180 degrees can be extracted from the closed loop differential transmission line 402.

When the rotary-based oscillator 400 with N=4 sections is used as an LO in a radio front end, the ability to extract signals that are separated by 90 degrees in phase means that in-phase and quadrature components of the resonant frequency signal can be directly extracted from the rotary-based oscillator 400. This is advantageous for use in various quadrature modulation schemes.

The rotary-based oscillator 400 is able to directly generate signals in the mmW frequency range (e.g., 70 GHz and higher). Because the closed loop differential transmission line 402 and 2-D floating metal mesh stacks 404 are implemented on-chip, the rotary-based oscillator 400 can function as an on-chip mmW LO.

Although FIG. 4 illustrates one example of the rotary-based oscillator 400, various changes may be made to FIG. 4. For example, the number of sections N could be changed, the amount and size of the 2-D floating metal mesh stacks 404 could be changed, etc.

Figure 5:
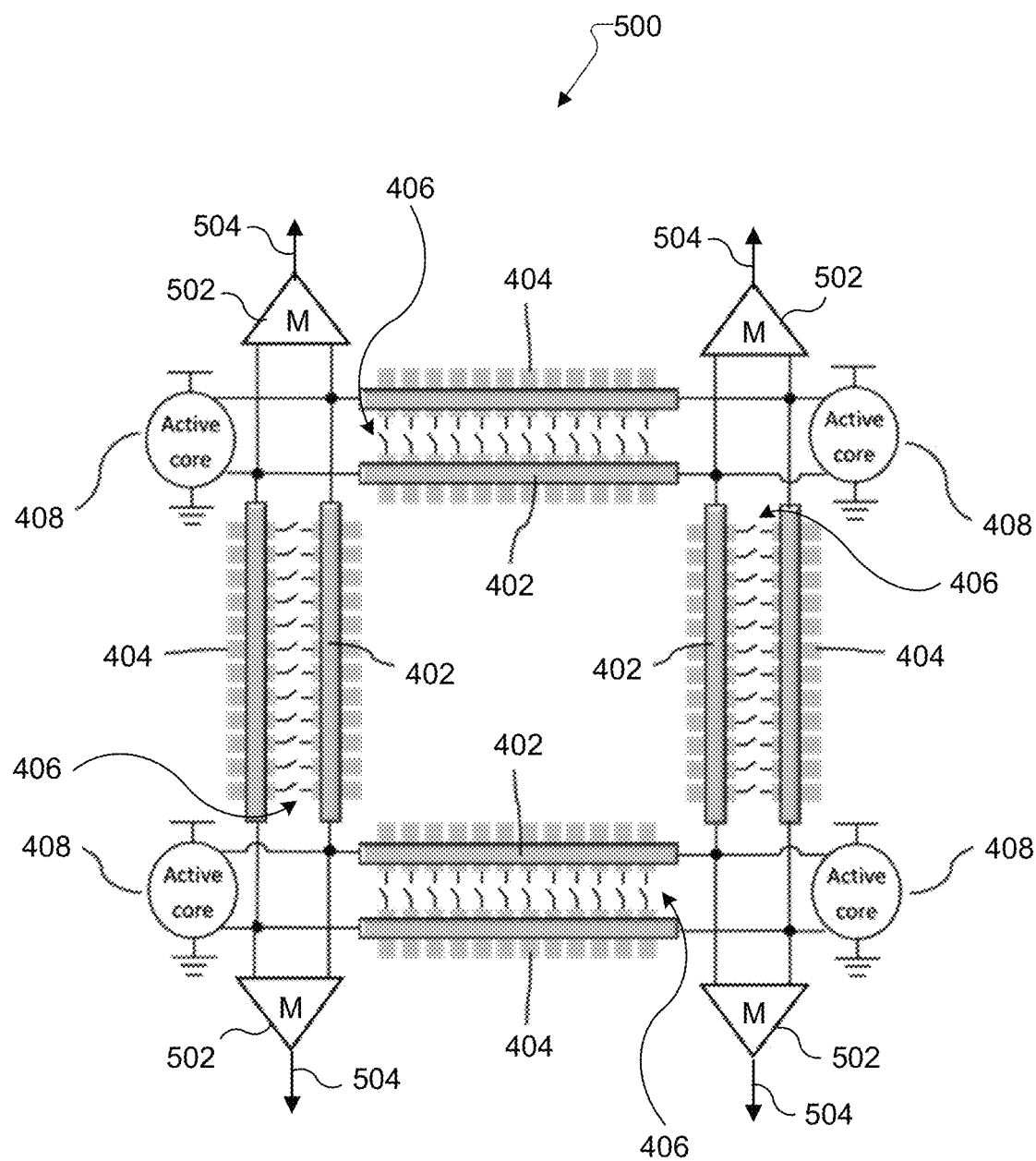
FIG. 5 illustrates a top-down view block diagram of another rotary-based oscillator according to embodiments of the present disclosure.

FIG. 5 illustrates a top-down view block diagram of a rotary-based oscillator 500 according to embodiments of the present disclosure. The rotary-based oscillator 500 adds frequency multiplication to the rotary-based oscillator 400. Accordingly, in this embodiment the rotary-based oscillator 500 is implemented with semiconductor technology embedded in an IC package. For example, the rotary-based oscillator 500 can be implemented on-chip with other radio front end components. The rotary-based oscillator 500 can be implemented for use as an LO in the gNB 102, the UE 116, or any other wireless communication device of wireless network 100.

The rotary-based oscillator 500 comprises all of the elements of the rotary-based oscillator 400, and additionally comprises a frequency multiplier 502 at each output 410 of the rotary-based oscillator 500. Each frequency multiplier 502 multiplies the frequency of the output by M. This extends the frequency tuning range of the rotary-based oscillator 500 by M times the frequency tuning range of the underlying rotary-based oscillator 400.

The signal generated by the rotary-based oscillator 500 can be extracted from any of the outputs 504. As in the rotary-based oscillator 400, the signal at each output 504 corresponds to a different phase of the resonant frequency signal traveling around the closed loop differential transmission line 402. In this embodiment, the frequency multiplier 502 at each output 504 combines the signals from each leg of the closed loop differential transmission line 402 to perform frequency multiplication by M. However, because there are 4 outputs 504, the signal at each output 504 is phase shifted by 90 degrees from the signal at the neighboring output 504, and the rotary-based oscillator 500 is still able to directly generate in-phase and quadrature components for use as an LO.

Because the underlying rotary-based oscillator 400 is able to produce mmW frequency outputs (e.g., 70 GHz and up), very high output frequencies can be achieved by the rotary-based oscillator 500 with the use of a relatively low value of M. As a result, relatively low power and little area in the IC are needed to achieve very high output frequencies as compared to architectures that begin with lower frequency LO outputs (e.g., 15 GHz) and use large amounts of frequency multiplication to achieve mmW frequency signals.

Figure 6:
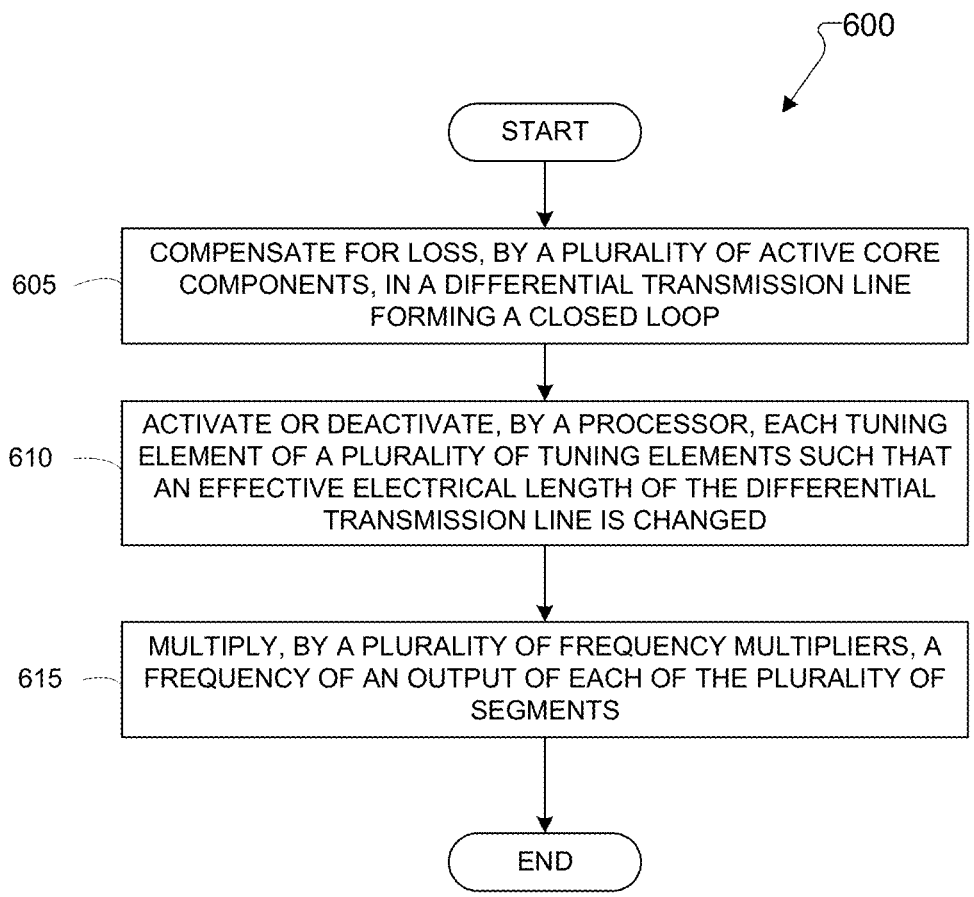
FIG. 6 illustrates an example process for operating a local oscillator in accordance with various embodiments of the present disclosure.

FIG. 6 illustrates an example process 600 for operating a local oscillator in accordance with various embodiments of the present disclosure. In this example, the local oscillator is a rotary-based oscillator 400 or 500 as discussed above with respect to FIGS. 4 and 5. The rotary-based oscillator 400 or 500 in this example could be implemented in a gNB 102 or a UE 116 as discussed above with respect to FIGS. 1-3, however it is understood that that the rotary-based oscillator 400 or 500 could be implemented in any suitable device that includes a mmW/RF radio front end.

The process 600 of this example is implemented in a rotary-based oscillator that comprises a differential transmission line forming a closed loop, a plurality of active core components, a plurality of tuning elements, and a plurality of frequency multipliers. The differential transmission line is comprised of a pair of conductors and is divided into a plurality of segments (e.g., divided into N segments). Each active core component is electrically connected to the differential transmission line between two of the segments. An output of each of the plurality of segments represents a different phase-shifted version of a signal traveling through the differential transmission line (e.g., a resonant frequency signal at the resonant frequency of the closed loop differential transmission line). One of the plurality of frequency multipliers is connected to the output of each segment of the plurality of segments.

The process 600 begins by compensating for a loss, by the plurality of active core components, in the closed loop differential transmission line (step 605). Because the differential transmission line is comprised of conductors, there is inherently a loss in power of the signal as it travels through the differential transmission line, and the plurality of active core components counteract this loss by providing, collectively, a gain greater than 1 to the system of the rotary-based oscillator. By distributing this gain across a plurality of active core components rather than using one active core component, phase noise induced by the active core components is reduced. The plurality of active core components may be, e.g., VCOs.

The process then activates or deactivates, by a processor, each tuning element of the plurality of tuning elements such that an effective electrical length of the differential transmission line is changed (step 610). Each tuning element of the plurality of tuning elements is comprised of a pair of dielectric elements and a switch. Each pair of dielectric elements, in turn, comprises a two-dimensional conductor, and each dielectric element of the pair of dielectric elements is disposed at a distance from a respective one of the pair of conductors of the differential transmission line. The switch of each tuning element is configured to electrically connect the pair of dielectric elements. At step 610, activating or deactivating each tuning element comprises closing or opening, by the processor, the switch of each tuning element in order to activate or deactivate, respectively, the tuning element.

The plurality of tuning elements are disposed substantially perpendicular to the differential transmission line and are electrically coupled to the differential transmission line through an electric field induced by the signal traveling through the differential transmission line. The effective electrical length of the differential transmission line corresponds to a permittivity experienced by the electric field based on each tuning element that is activated. For example, each tuning element that is activated increases the permittivity (e.g., the dielectric constant ε) experienced by the electric field.

The process next multiplies, by the plurality of frequency multipliers, a frequency of an output of each of the plurality of segments of the differential transmission line (step 615). For example, each frequency multiplier could multiply the output by M times. The rotary-based oscillator architecture allows the frequency at the outputs of the differential transmission line to be high (e.g., 70 GHz), and accordingly very high frequency outputs can be obtained with relatively low M values (e.g., 140 GHz output with M=2). In some embodiments, the frequency multipliers utilize the 180 degree phase shifted signals from each branch of the differential transmission line to perform the frequency multiplication, resulting in a combined signal output with a different phase. Due to the rotary-based oscillator architecture, different phases of the resonant frequency signal can be extracted without additional phase shifting. For example, with N=4 segments, each output is phase-shifted 90 degrees from the neighboring output.

Although FIG. 6 illustrates one example process for operating a local oscillator, various changes may be made to FIG. 6. For example, in some embodiments, the frequency multipliers are not included, and no frequency multiplication is performed on the output of the rotary-based oscillator. Rather, the output of the rotary-based oscillator is directly extracted as the local oscillator. In an embodiment that does not include the frequency multipliers of step 615, two sets of signals can be extracted from each output of the rotary-based oscillator: each set is phase-shifted 180 degrees from the other set, and the signal at each output of the differential transmission line is phase-shifted 90 degrees from the signal at the neighboring output. E.g., one set has phases of 0, 90, 180, and 270 degrees at each output, respectively, and the second set has phases of 180, 270, 0, and 90 degrees at each output, respectively.

The above flowcharts illustrate example methods that can be implemented in accordance with the principles of the present disclosure and various changes could be made to the methods illustrated in the flowcharts herein. For example, while shown as a series of steps, various steps in each figure could overlap, occur in parallel, occur in a different order, or occur multiple times. In another example, steps may be omitted or replaced by other steps.

Although the present disclosure has been described with exemplary embodiments, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. An oscillator apparatus comprising:
a differential transmission line comprised of a plurality of segments forming a closed loop;
a plurality of voltage controlled oscillators that are electrically connected to the differential transmission line and that are configured to compensate for loss in the differential transmission line;
a plurality of frequency multipliers, each of which is electrically connected to an output of a respective segment of the plurality of segments, each of the frequency multipliers configured to combine signals traveling through each of a pair of legs of the differential transmission line at the output of the respective segment to generate an output having a phase that is shifted relative to a phase of each of the signals and having a frequency that is a multiple of a frequency of the signals;
a plurality of tuning elements that are electrically coupled with the differential transmission line; and
a processor configured to control each tuning element of the plurality of tuning elements to activate or deactivate such that an effective electrical length of the differential transmission line is changed.

2. The oscillator apparatus of claim 1, wherein:
the plurality of tuning elements are coupled to the differential transmission line through an electric field induced by a signal traveling through the differential transmission line, and
the effective electrical length of the differential transmission line corresponds to a permittivity experienced by the electric field based on each tuning element that is activated.

3. The oscillator apparatus of claim 1, wherein:
each voltage controlled oscillator is electrically connected to the differential transmission line between two of the segments.

4. The oscillator apparatus of claim 3, wherein:
an output of each of the plurality of segments represents a different phase-shifted version of a signal traveling through the differential transmission line.

5. The oscillator apparatus of claim 1, wherein:
the differential transmission line comprises a pair of conductors that form the pair of legs of the differential transmission line,
each tuning element of the plurality of tuning elements comprises:
a pair of dielectric elements, wherein each dielectric element of the pair of dielectric elements is disposed at a distance from a respective one of the pair of conductors of the differential transmission line; and
a switch configured to electrically connect the pair of dielectric elements, and
the processor is configured to control the switch of each tuning element to close or open in order activate or deactivate, respectively, the tuning element.

6. The oscillator apparatus of claim 5, wherein:
each dielectric element of each tuning element comprises a two-dimensional conductor, and
each of the tuning elements is disposed substantially perpendicular to and spaced apart from the differential transmission line.

7. An oscillator apparatus comprising:
a differential transmission line comprised of a plurality of segments forming a closed loop;
a plurality of voltage controlled oscillators that are electrically connected to the differential transmission line and that are configured to compensate for loss in the differential transmission line;
a plurality of frequency multipliers that are electrically connected to the differential transmission line at an output of a respective segment of the plurality of segments, each of the frequency multipliers having a multiplication factor and being configured to combine signals traveling through each of a pair of legs of the differential transmission line at the output of the respective segment such that an output of the respective frequency multiplier has a phase that is shifted relative to a phase of each of the signals and has a frequency that represents a frequency of the signals multiplied by the multiplication factor, in order to extend a frequency tuning range of the oscillator apparatus;
a plurality of tuning elements that are electrically coupled with the differential transmission line; and
a processor configured to control each tuning element of the plurality of tuning elements to activate or deactivate such that an effective electrical length of the differential transmission line is changed.

8. The oscillator apparatus of claim 7, wherein:
the plurality of tuning elements are coupled to the differential transmission line through an electric field induced by a signal traveling through the differential transmission line, and
the effective electrical length of the differential transmission line corresponds to a permittivity experienced by the electric field based on each tuning element that is activated.

9. The oscillator apparatus of claim 7, wherein:
each voltage controlled oscillator is electrically connected to the differential transmission line between two of the segments.

10. The oscillator apparatus of claim 7, wherein:
the differential transmission line comprises a pair of conductors that form the pair of legs of the differential transmission line,
each tuning element of the plurality of tuning elements comprises:
a pair of dielectric elements, wherein each dielectric element of the pair of dielectric elements is disposed at a distance from a respective one of the pair of conductors of the differential transmission line; and
a switch configured to electrically connect the pair of dielectric elements, and
the processor is configured to control the switch of each tuning element to close or open in order activate or deactivate, respectively, the tuning element.

11. The oscillator apparatus of claim 10, wherein:
each dielectric element of each tuning element comprises a two-dimensional conductor, and each of the tuning elements is disposed substantially perpendicular to and spaced apart from the differential transmission line.

12. A method of operating an oscillator apparatus, comprising:
   compensating for loss, by a plurality of voltage controlled oscillators, in a differential transmission line comprised of a plurality of segments forming a closed loop;
   combining, by a plurality of frequency multipliers that are each electrically connected to an output of a respective segment of the plurality of segments, signals traveling through each of a pair of legs of the differential transmission line at the output of the respective segment to generate an output having a phase that is shifted relative to a phase of each of the signals and having a frequency that is a multiple of a frequency of the signals; and
   activating or deactivating, by a processor, each tuning element of a plurality of tuning elements such that an effective electrical length of the differential transmission line is changed, wherein the plurality of tuning elements are electrically coupled to the differential transmission line.

13. The method of claim 12, wherein:
   the plurality of tuning elements are coupled to the differential transmission line through an electric field induced by a signal traveling through the differential transmission line, and
   the effective electrical length of the differential transmission line corresponds to a permittivity experienced by the electric field based on each tuning element that is activated.

14. The method of claim 12, wherein:
   each voltage controlled oscillator is electrically connected to the differential transmission line between two of the segments.

15. The method of claim 14, wherein:
   an output of each of the plurality of segments represents a different phase-shifted version of a signal traveling through the differential transmission line.

16. The method of claim 12, wherein:
   the differential transmission line comprises a pair of conductors that form the legs of the differential transmission line,
   each tuning element of the plurality of tuning elements comprises:
      a pair of dielectric elements, wherein each dielectric element of the pair of dielectric elements is disposed at a distance from a respective one of the pair of conductors of the differential transmission line; and
      a switch configured to electrically connect the pair of dielectric elements, and
   the method further comprises closing or opening, by the processor, the switch of each tuning element in order activate or deactivate, respectively, the tuning element.

17. The method of claim 16, wherein:
   each dielectric element of each tuning element comprises a two-dimensional conductor, and
   each of the tuning elements is disposed substantially perpendicular to and spaced apart from the differential transmission line.

* * * * *